(12) United States Patent
Hentges et al.

(10) Patent No.: US 6,838,404 B2
(45) Date of Patent: Jan. 4, 2005

(54) METAL ALKOXIDES AND METHODS OF MAKING SAME

(75) Inventors: Patrick J. Hentges, Urbana, IL (US);
Laura H. Greene, Urbana, IL (US);
Margaret Mary Pafford, Yardley, PA (US); Glenn Westwood, Urbana, IL (US); Walter G. Klemperer, Champaign, IL (US)

(73) Assignee: Board of Trustees of University of Illinois, Urbana, IL (US)

(*) Notice: Subject to any disclaimer, the term of this patent is extended or adjusted under 35 U.S.C. 154(b) by 116 days.

(21) Appl. No.: 10/044,831

(22) Filed: Jan. 9, 2002

(65) Prior Publication Data

US 2003/0130127 A1 Jul. 10, 2003

(51) Int. Cl.$^7$ .......................... C04B 35/50; C04B 35/51
(52) U.S. Cl. ...................... 501/152; 501/103; 423/21.2; 423/71; 423/608; 423/263
(58) Field of Search ........................... 423/21.1, 69, 71, 423/608, 263, 21.2; 501/102, 103, 134, 152; 505/510–512

(56) References Cited

U.S. PATENT DOCUMENTS

| | | | | |
|---|---|---|---|---|
| 6,096,437 A | * | 8/2000 | Soucek et al. | 428/470 |
| 6,139,813 A | * | 10/2000 | Narula et al. | 423/213.2 |
| 6,143,272 A | * | 11/2000 | Narula et al. | 423/608 |
| 6,288,255 B1 | * | 9/2001 | Skinner | 556/55 |
| 6,365,123 B1 | * | 4/2002 | Narula et al. | 423/608 |
| 6,660,686 B2 | * | 12/2003 | Inagaki et al. | 502/349 |

FOREIGN PATENT DOCUMENTS

JP 09-2410008 A2 9/1997

OTHER PUBLICATIONS

Day, Victor W. "Isolation and Structural Characterization of Tetra–n–propyl Zirconate in Hydrocarbon Solution and the Solid State", Inorganic Chemistry, 2001, vol. 40, No. 23, pp. 5738–5746.*

Bradley, D.C., et al., "Zirconium Alkoxides", *J. Chem.Soc.*, 1951, p. 280–285.

Bradley, D.C., et al., "Structural Chemistry of the Alkoxides. Part IV, Normal Alkoxides Silicon, Titanium, and Zirconium", *J. Chem.Soc.*, 1953, pp. 2025–2030.

Bradley, D.C., et al., "The Pyrolysis of Metal Alkoxides. Part 2—Kinetic Studies on Zirconium Tetra–Tert.–Amyloxide", *Trans. Faraday Soc.*, 1959, vol. 55, pp. 2117–2123.

Bradley, D.C et al., "Pyrolysis of Metal Alkoxides. I. Thermal Stability of Some Zirconium Alkoxides", *J. appl. Chem.*, 1959, vol. 9, pp. 435–439.

Covington, M., et al., "Observation of Surface–Induced Broken Time–Reversal Symmetry in YBa2Cu3O7 Tunnel Junctions", *Physical Review Letters*, 1997, vol. 79, No. 2, pp. 277–280.

(List continued on next page.)

*Primary Examiner*—Stanley S. Silverman
*Assistant Examiner*—Colleen P. Cooke
(74) *Attorney, Agent, or Firm*—Brinks Hofer Gilson & Lione

(57) ABSTRACT

A method of making a superconducting structure includes depositing a metal alkoxide on a surface of a metal and hydrolyzing the metal alkoxide on the surface to form a pinhole-free film. The metal is a superconductor. The metal alkoxide may be a compound of formula (I):

$$M_4(OPr^n)_{16} \qquad (I);$$

where M is zirconium or hafnium, and the purity of the compound is at least 97% as measured by NMR spectroscopy.

4 Claims, 7 Drawing Sheets

OTHER PUBLICATIONS

Day, Victor W., et al., "Isolation and Structural Characterization of tra–n–propyl Zircor Hydrocarbon Solution and the Solid State", *Inorg. Chem.*, 2001, vol. 40, No. 23, p. 5738–5746.

Hentges, P.J., et al., "Fabrication of Tunnel Barriers on YBCO Thin Films by Chemical Surface Modification", Abstract from Mar. 2000 meeting of the American Physical Society, printed from the Internet at: <http://www.aps.org/meet/MAROO/baps/abs/S2110001.html>, dated Mar. 2000, 1 page.

Hentges, P.J., et al., "Observation of Sharp, New Density of States Features in Solution–Fabricated YBCO Planar Tunnel Junctions", Abstract from Mar. 2001 meeting of the American Physical Society, printed from the Internet at: <http://www.aps.org/meet/MARO1/baps/abs/S5270003.html>, dated Mar. 2001, 1 page.

Ichinose, Izumi, et al., "Stepwise Adsorption of Metal Alkoxides on Hydrolyzed Surfaces: A Surface Sol–Gel Process", *Chemistry Letters*, 1996, p. 831–832.

Ichinose, Izumi, et al., "A Surface Sol–Gel Process to TiO2 and Other Metal Oxide Films Molecular Precision", *Chem. Mater*, 1997, vol. 9, No. 6, pp. 1296–1298.

Pafford, Mary Margaret, "Synthesis aiNa Characterization of Alkyi Tetra–, Tri–, and Triskaidecazirconates", Doctoral Thesis submitted in the Graduate College of the University of Illinois at Urbana–Champaign, 2000, pp. I–xiii and 1–167.

Tada, Hiroaki, "Layer–by–Layer Construction of SiOx Film on Oxide Semiconductors", *Langmuir*, 1995, vol. 11, No. 9, pp. 3281–3284.

Turevskaya, et al., "The alkoxides of zirconium and hafnium: direct electrochemical synthesis and mass–spectral study. Do "M(OR)4", where M=Zr, Hf, Sn, really exist?", *Russian Chemical Bulletin*, 1995, vol. 44, No. 4, pp. 734–742.

Turova, N. Ya, et al., "Physicochemical approach to the studies of metal alkoxides", *Polyhedron*, 1998, vol. 17, No. 5–6, pp. 899–915.

Zechmann, Cecilia A., et al., "Synthesis of Zirconium Pinacolate and Mechanism of Its Thermal Transformation to ZrO2: Impact of a Vicinal Diol Ligand", *Chem. Mater.*, 1998, vol. 10, No. 9, pp. 2348–2357.

\* cited by examiner

METAL ALKOXIDES AND METHODS OF MAKING SAME

FEDERALLY SPONSORED RESEARCH OR DEVELOPMENT

The subject matter of this application was in part funded by the Department of Energy (Grant nos. DE-FG02-91 ER45349). The government may have certain rights in this invention.

BACKGROUND

Insulating films on metals, including alloys of metals and metallic compounds, are useful for a variety of applications, including insulation of devices and construction of devices such as microprocessor components. One particularly useful application of insulating films is the fabrication of tunnel junctions. These junctions are prepared by sandwiching a thin layer of a material which is normally an insulator between two conducting metals. The conductors may both be non-superconducting metals; they may both be superconducting metals; or one metal may be superconducting while the other metal is non-superconducting. A superconductor is any material which exhibits superconductivity at any temperature, preferably at a temperature above 0.01K. Tunnel junctions between two non-superconducting metals can be used, for example, to make capacitors or resistors having conductance properties which are not dependent on temperature. Tunnel junctions between two superconductors, known as Josephson junctions, can be used, for example, to make a transistor which can be used in a superconducting computer.

The term "metal" as used herein refers to substances made of a single metal such as gold, silver, copper, platinum, or lead; to substances made from an alloy of two or more metals; and to substances made from a metallic compound, optionally containing non-metallic elements. Examples of metal alloys include niobium-germanium alloys (NbGe) and niobium-titanium alloys (NbTi). Examples of metallic compounds include ceramic superconductors and oxide ceramic superconductors, such as $YBa_2Cu_3O_7$ (YBCO).

Superconductors, especially oxide ceramic superconductors, are complex materials that are difficult to prepare in a tunnel junction. It has been extremely difficult to coat the surface of oxide superconductors with a thin insulating film without disordering the surface of the superconductor and/or yielding the insulating film with defects, such as pinholes. Oxide superconductors are also known to be environmentally sensitive and tend to degrade in atmospheres which are not inert.

In order for tunneling to occur through an insulating layer, the layer should be as thin as possible. Tunneling current decreases in an exponential fashion with the thickness of the substance through which the tunneling occurs. Thus, a film which is thick will not allow a tunneling current which is large enough to be useful. Preferably, an insulating tunnel barrier has a thickness of 30 angstroms (Å) or less.

One class of useful insulating films is the metal oxide family of general formula $MO_x$ (where "M" is a metal and x is from 0.01 to 4), which can be prepared through a variety of techniques. For example, chemical vapor deposition (CVD) of a metal oxide can be accomplished by treatment of the surface with a vaporized metal or a vaporized metal alkoxide of the general formula $M(OR)_y$, where y is from 1 to 8, and R is an alkyl group. "Alkyl" refers to a substituted or unsubstituted, straight, branched or cyclic hydrocarbon chain containing from 1 to 20 carbon atoms. The chemisorbed layer formed is then treated with an activating agent such as an oxidizing agent or water, or by exposure to heat or light. (Toda et al. *Langmuir*, 11, 3281 (1995)) In another example, a metal alkoxide can be adsorbed onto the surface from a solution. The surface layer can then be heated to break down the metal alkoxide, followed by treatment of the surface with water to form the $MO_x$ film.

Lead oxide ($PbO_x$) films can be formed on superconducting materials by the thermal evaporation of lead onto the surface of the superconductor, typically $YBa_2Cu_3O_7$ (YBCO). It is believed that the lead oxide film is formed utilizing oxygen atoms present in the superconductor. This technique disorders the surface of the oxide layer, and this disorder adversely affects the reproducibility and stability of the tunneling process. Bismuth oxide ($BiO_x$) films can be formed in a similar manner, but with similar disordering of the surface.

Sol-gel processes may also used to produce oxide films on surfaces. These pocesses involve deposition of a metal alkoxide onto the surface from a solution, hydrolysis of the chemisorbed metal alkoxide, and drying of the oxide film produced. See, for example, Ichinose et al. *Chemistry Letters*, 831–832 (1996); Ichinose et al. *Chemistry of Materials*, 9, 1296–1298 (1997); and Japanese patent application JP 09241008 A2. Although this process also produces a disordered surface structure, it does enable the preparation of oxide films incorporating a variety of metal species. Metal oxides of particular interest include zirconium oxides and oxides of similar metals, such as hafnium and titanium. These oxides have been especially difficult to use in preparing reproducible, ultrathin films. The resistances of the oxide films formed by conventional techniques is too high for the films to be useful in sensitive devices such as a Josephson junction.

It is thus desirable to provide oxide films on metals which are extremely thin, yet without defects or holes. Preferably, these oxide films can be formed in a reproducible fashion. High-quality, ultrathin oxide films would likely be useful as tunnel junctions between superconductors and metals.

BRIEF SUMMARY

In a first aspect, the present invention includes a method of making a superconducting structure, comprising depositing a metal alkoxide on a surface of a metal and hydrolyzing the metal alkoxide on the surface to form a pinhole-free film. The metal is a superconductor.

In a second aspect, the present invention includes a superconducting structure prepared by the above method.

In a third aspect, the present invention includes a superconducting structure, comprising a ceramic superconductor and a pinhole-free film on the ceramic superconductor.

In a fourth aspect, the present invention includes a tunnel junction, comprising a superconducting structure as described above and a second metal on the pinhole-free film.

In a fifth aspect, the present invention includes a compound of formula (I):

$$M_4(OPr^n)_{16} \qquad (I).$$

M is zirconium or hafnium, and the purity of the compound is at least 97% as measured by NMR spectroscopy.

In a sixth aspect, the present invention includes a method of making the above compound, comprising distilling $M(OPr^n)_4$.

In a seventh aspect, the present invention includes a superconducting structure, comprising a ceramic superconductor and a metal oxide coating on the ceramic superconductor. The electronic structure of the ceramic superconductor is unchanged when the superconducting structure is stored in air at 25° C. at 100% humidity for at least one week.

In an eighth aspect, the present invention includes a method of making a metal structure, comprising depositing a metal alkoxide on a surface of a metal and hydrolyzing the metal alkoxide on the surface. The metal alkoxide is a compound of formula $M_4(OPr^n)_{16}$, and M is zirconium or hafnium.

In a ninth aspect, the present invention includes a metal structure prepared by the above method.

In a tenth aspect, the present invention includes a tunnel junction, comprising the metal structure as described above and a second metal on the metal oxide surface.

In an eleventh aspect, the present invention includes a method of making a superconducting device, comprising forming a superconducting structure as described above and forming a superconducting device from the superconducting structure.

In a twelfth aspect, the present invention includes a method of making an electronic device, comprising forming a metal structure as described above and forming an electronic device from the metal structure.

DETAILED DESCRIPTION

Figure 1:
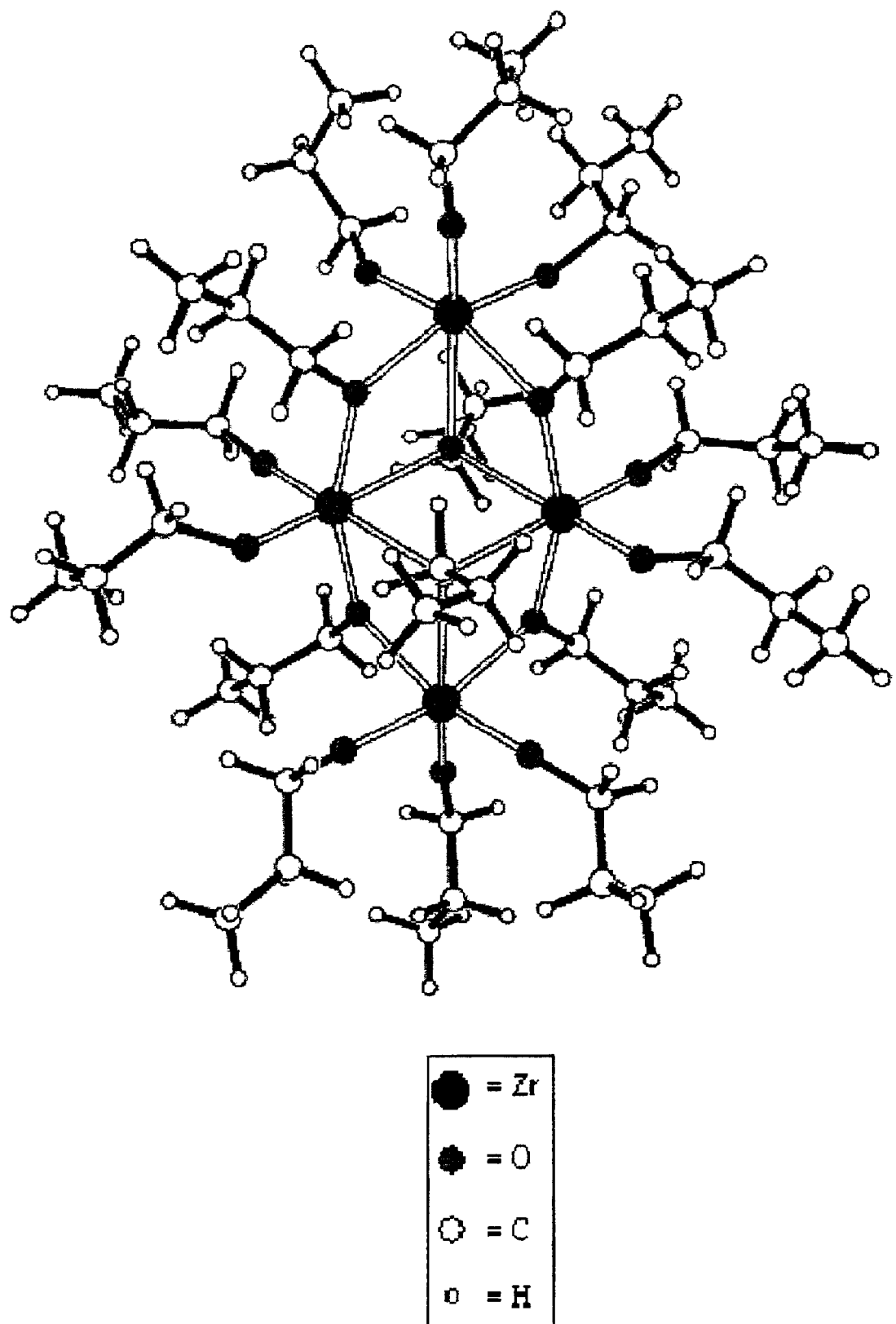
FIG. 1 is a diagram of a possible structure for $Zr_4(OPr^n)_{16}$.

The present invention includes a method of forming metal oxide layers on surfaces. The method includes deposition of a metal alkoxide onto the surface, hydrolysis of the resulting metal alkoxide layer, and repetition of the deposition and hydrolysis process. In this manner, tunnel barriers can be formed on metal surfaces, including metallic compounds such as ceramic superconductors and oxide ceramic superconductors. This method is particularly useful for the formation of $ZrO_2$ films and films of related metal oxides. The method can provide ultrathin films which are free of defects such as pinholes. The present invention also includes films formed by the method.

Typically, the metal alkoxides used as starting materials for the formation of thin oxide films are "n-alkyl ortho" species of formula $M(OR^n)_4$, for example $Zr(OR^n)_4$ and $Hf(OR^n)_4$, where $R^n$ denotes an unbranched alkyl group bonded to the oxygen through a terminal carbon. These formulas are empirical formulas, and samples of the alkoxides are believed to include a variety of compounds and molecular formulas, such that the overall molar ratio of metal to alkoxide in a sample is approximately 1:4. The reactivity of these metal alkoxides contributes to their utility in the formation of metal oxide ($MO_x$) films, as illustrated in the following general reaction scheme.

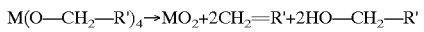

This reaction is believed to be a chain reaction including the following steps.

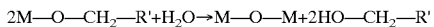

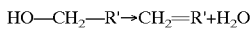

Metal n-alkoxide decomposition can thus be induced by trace amounts of an initiator, usually water or alcohol. (Bradley, D. C. et al. *Trans. Faraday Soc.*, vol. 55, 2117–2123 (1959); Bradley, D. C. et al. *J. Appl. Chem.*, vol. 9, 435–439 (1959)) In fact, the oxide material $ZrO_2$ is known to be a catalyst for alcohol dehydration. (Zechmann, C. A. et al. *Chem. Mater.*, vol. 10, 2348–2357 (1998))

Although metal alkoxides readily react to form $MO_x$, a disadvantage to this reactivity is the difficulty of preparing absolutely pure $M(OR^n)_4$. Rather, samples of $M(OR^n)_4$ actually contain a certain amount of M—O—M and/or M—OH moieties. For example, Zr(IV) n-alkoxides and other Zr(IV) alkoxides containing β-hydrogen atoms are extremely difficult to purify. (Turevskaya, E. P. et al. *Russ. Chem. Bull.*, vol. 44, 734–742 (1995); Turova, N. Y. et al. *Polyhedron*, vol. 17, 899–915 (1998)) Crystallization does not generally improve the purity of $Zr(OPr^n)_4$, and repeated recrystallizations typically yield increasingly impure material, possibly because of the extreme moisture-sensitivity of the compound.

One example is $Zr_4(OPr^n)_{16}$, which can be prepared from tetra-n-propyl zirconate, $Zr(OPr^n)_4$. The starting material $Zr(OPr^n)_4$ may be prepared by treating $ZrCl_4$ with n-propanol in the presence of ammonia. (Bradley, D. C. et al. *J. Chem. Soc.*, 280–285 (1951)) An alternative method of preparing $Zr(OPr^n)_4$, which typically yields product with higher purity, involves alkoxide exchange of tetra-isopropyl zirconate $(Zr(OPr^i)_4)$ with n-propanol. (Bradley, D. C. et al. *J. Chem. Soc.*, 2025–2030 (1953)) The tetra-n-propyl zirconate prepared by this method is characterized as a highly viscous liquid with a boiling point of 208° C. at 0.1 mm Hg. Tetra-n-propyl zirconate is typically provided as a 70 wt % solution in n-propanol, and the alcohol solvent can be removed by distillation at 85–98° C. under nitrogen ($N_2$) at ambient pressure to provide a waxy solid. The solid may then be fractionally distilled under $N_2$ at a pressure of about $10^{-2}$ mm Hg. The fraction that distills at 225–245° C. is a clear, colorless liquid that solidifies upon contact with the receiving flask. This fraction is pure $Zr(OPr^n)_4$ and is believed to have the molecular formula $Zr_4(OPr^n)_{16}$.

In the method of the present invention, $Zr(OPr^n)_4$ is purified by fractional distillation at low pressure, for example $10^{-2}$ mm Hg. The first distillation fraction, a highly viscous liquid at ambient temperature and pressure, is collected between 185–220° C. The amount of material collected in the first fraction is dependent upon the purity of the crude material, with relatively pure starting material yielding a relatively small amount of the first fraction. The first fraction, containing both $Zr(OPr^n)_4$ and its hydrolysis product $Zr_3O(OPr^n)_{10}$, is similar to the liquid produced by the $Zr(OPr^i)_4$/n-propanol exchange. The second distillation fraction, collected between 225 and 245° C., is analytically pure $Zr_4(OPr^n)_{16}$, a white solid at ambient temperature and pressure. The method of purification by distillation at low pressure and high temperature over a short time period can likely be extended to other metal alkoxide systems, including alkoxide compounds of hafnium, titanium, scandium, yttrium, indium, and ytterbium.

Analytically pure tetra-n-propyl zirconate is identified by proton nuclear magnetic resonance spectroscopy ($^1$H NMR) in cyclohexane-$d_{12}$ solution at ambient temperature. In the spectrum for $Zr(OPr^n)_4$, four triplets are observed in the methyl proton region at δ0.94, 0.90, 0.86, and 0.83, with relative intensities 3:2:2:1. If the hydrolysis product $Zr_3O(OPr^n)_{10}$ is present in the sample, however, low-intensity triplets can be observed at δ0.93 and 0.92. (Turova et al., 1998) Due to the extreme moisture-sensitivity of $Zr_4(OPr^n)_{16}$, NMR samples are almost invariably contaminated with 1–3% of this impurity. Also, elemental analyses generally report slightly higher values for zirconium and slightly lower values for carbon, relative to the amounts calculated for each based on the ratios in the empirical formula. Preferably, $Zr_4(OPr^n)_{16}$ has a purity of at least 97% as measured by NMR spectroscopy. More preferably, $Zr_4(OPr^n)_{16}$ has a purity of at least 99% as measured by NMR spectroscopy. The crystal structure of analytically pure $Zr_4(OPr^n)_{16}$ has been reported in Day, V. W. et al., *Inorg. Chem.*, vol. 40, 5738–5746 (2001). Without wishing to be bound by any theory of operation, it is believed that $Zr_4(OPr^n)_{16}$ has the single crystal structure illustrated in FIG. 1.

The analytically pure $Zr_4(OPr^n)_{16}$ can be used to form thin $ZrO_2$ films which are free of defects. The process for producing these films preferably follows a sequence of deposition of the metal alkoxide, hydrolysis of the surface containing the metal alkoxide, and repetition of the deposition and hydrolysis until a film of the desired thickness is formed. The metal substrate to be coated is contacted with a solution of $Zr_4(OPr^n)_{16}$ in an inert solvent. An inert solvent is defined as a solvent which does not react substantially with the zirconium alkoxide or the substrate during the time necessary to form films, and includes diethylether, methylene chloride, 1,2-dichloroethane, and hydrocarbons such as methyl cyclohexane, toluene, benzene, heptane, and pentane. The substrate is thus coated with a layer of the metal alkoxide. Preferably, the deposition is carried out in an inert atmosphere, such as argon or nitrogen, to avoid premature hydrolysis of the zirconium compound.

Figure 2:
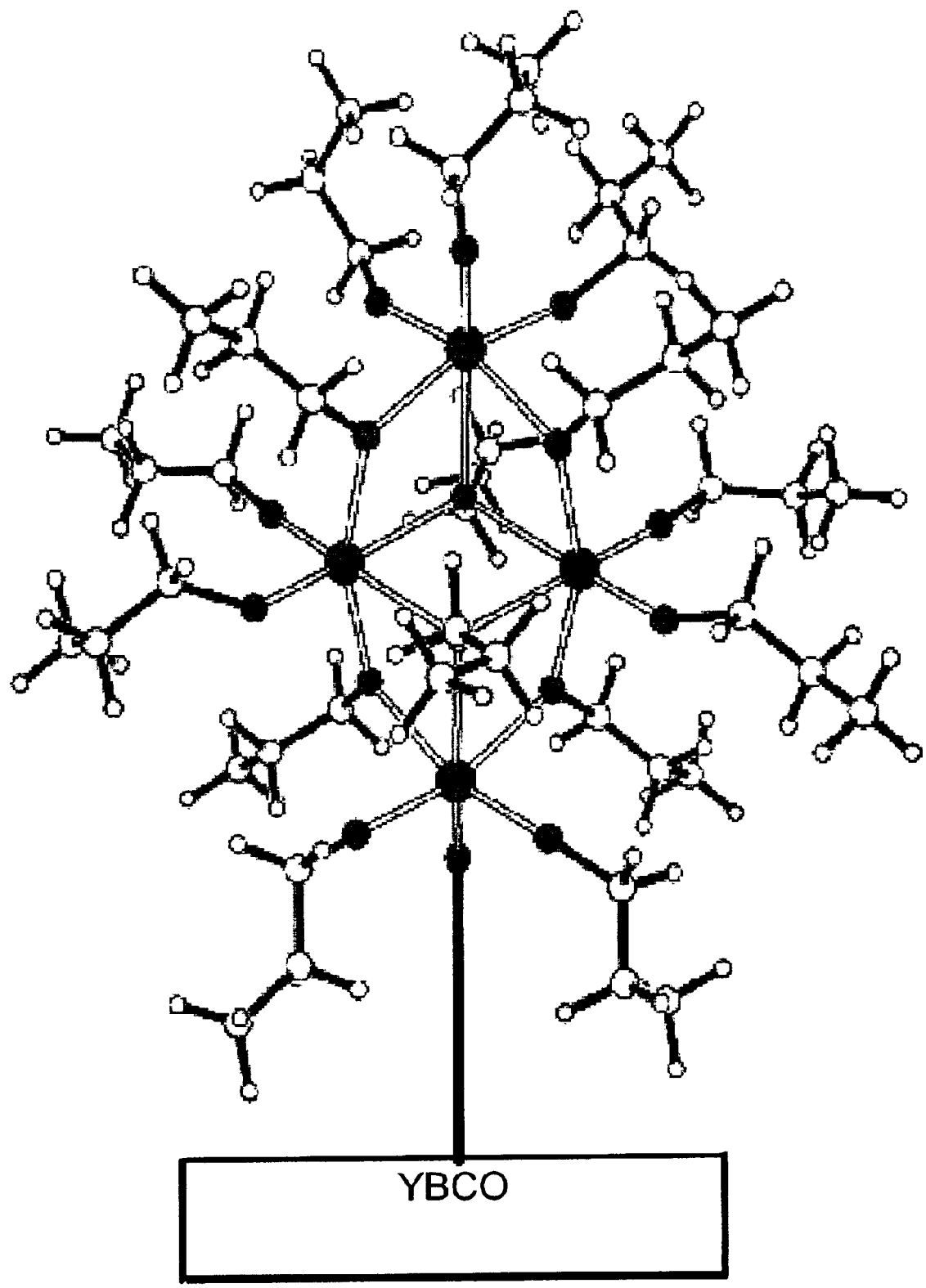
FIG. 2 is a diagram of a possible configuration of a zirconium alkoxide bound to a surface.

Without wishing to be bound by any theory of operation, it is believed that, due to the dimensions of the $Zr_4(OPr^n)_{16}$ compound, the layer is primarily a monolayer of the metal alkoxide. It is further believed that the interaction of $Zr_4(OPr^n)_{16}$ with a surface containing hydroxyl groups (—OH) results in the condensation of the zirconium compound with the surface and elimination of an equivalent of propanol. The zirconium compound is thus bound to the surface. A possible configuration of this surface-bound moiety is illustrated in FIG. 2.

The metal alkoxide layer is then treated with water to hydrolyze the metal-oxygen-carbon bonds. Preferably, the water is present as a mixture in n-propanol, more preferably as a mixture having a water to propanol ratio of about 1:4. Without wishing to be bound by any theory of operation, it is believed that introduction of water to the system results in hydrolysis of other Zr—O—C bonds, with the elimination of additional propanol and the formation of Zr—OH bonds. These hydroxyl groups (—OH) are thus believed to be available for condensation with additional $Zr_4(OPr^n)_{16}$ to form Zr—O—Zr bonds. The metal substrate having the hydrolyzed metal oxide on the surface can then be contacted with the $Zr_4(OPr^n)_{16}$ solution again, followed by another hydrolysis treatment with water. Continued repetition of the condensation and hydrolysis steps provides for a gradual buildup of zirconium oxide on the surface.

The surface of the substrate can be rinsed between each of these steps. For example, the surface may be rinsed with an inert solvent after a deposition of the zirconium alkoxide to insure that only zirconium alkoxide which is bound to the surface remains. The surface may be rinsed with propanol after the hydrolysis steps to assist in removing any residual water.

The oxide films formed by the method of the present invention can impart environmental stability to the metal substrate, maintaining the properties of the metal and the tunnel barrier even in an air atmosphere for one year or longer. Preferably, the oxide films can protect ceramic superconductors, including oxide ceramic superconductors, from environmental deterioration. It is believed that other metal oxides, when used in analytically pure form, can also form pinhole-free tunnel barrier films.

Figure 3:
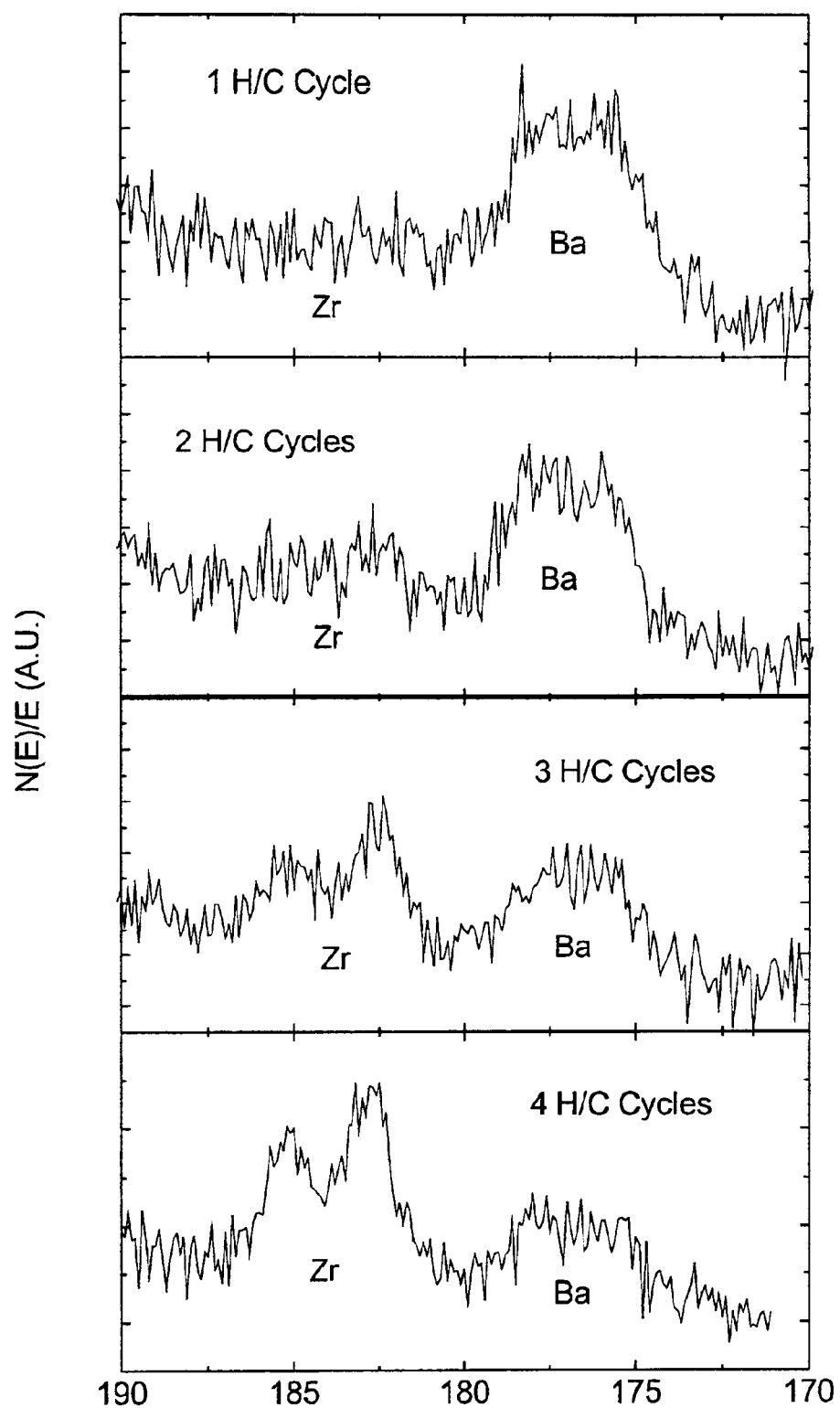
FIG. 3 is a set of X-ray photoelectron spectroscopy (XPS) spectra for different amounts of treatment with $Zr_4(OPr^n)_{16}$.

Analysis of the oxide layer by X-ray photoelectron spectroscopy (XPS) indicates that increased repetition of the deposition with $Zr_4(OPr^n)_{16}$ and hydrolysis with $H_2O$ increases the thickness of the $ZrO_2$ surface layer. As illustrated in the XPS spectra of FIG. 3 and the graph of XPS data in FIG. 4, the area of the zirconium peak relative to the area of the barium peak increases with increasing $Zr_4(OPr^n)_{16}$ treatments. A single treatment, referred to as a condensation/hydrolysis cycle, includes one deposition with $Zr_4(OPr^n)_{16}$ and one hydrolysis with water. Variation of the angle of measurement of XPS shows an increase in zirconium signal with decreasing angle ($\ominus$), as illustrated in the spectra of FIG. 5. This indicates that the zirconium is localized at the surface.

Analysis of the quality of the layers is preferably performed using planar tunneling spectroscopy (PTS). PTS provides a measure of conductance as a function of applied voltage, for a junction having an oxide layer positioned between two metals. Increases in conductance results in an increased tunneling of electrons through the oxide layer.

An example of a structure which can be analyzed by PTS is the superconductor/oxide/non-superconducting metal sandwich structure. This structure can be formed using the oxide film forming procedure described above. The oxide may be formed on the superconductor, or it may be formed on the non-superconducting metal. For oxide layers which are formed on a superconductor, the non-superconducting metal may be deposited on the oxide layer through a variety of methods. For example, the non-superconducting metal may be evaporated onto the layer, or the metal may be applied as a paste which is then dried. Examples of non-superconducting metals include gold, silver, copper, and platinum.

One indication of a high-quality oxide thin film is the sharpness of the features of the graph of conductance versus applied voltage. Sharper features indicate a more uniform response across the entire sampling area. That is, the tunneling of electrons is equally likely and is subject to equal resistance at any given point on the oxide surface. Heterogeneity of the composition or thickness of the oxide layer would result in a less uniform measure of conductance for a given voltage, thus making it more difficult to distinguish between the conductance at voltages which are similar.

Figure 6:
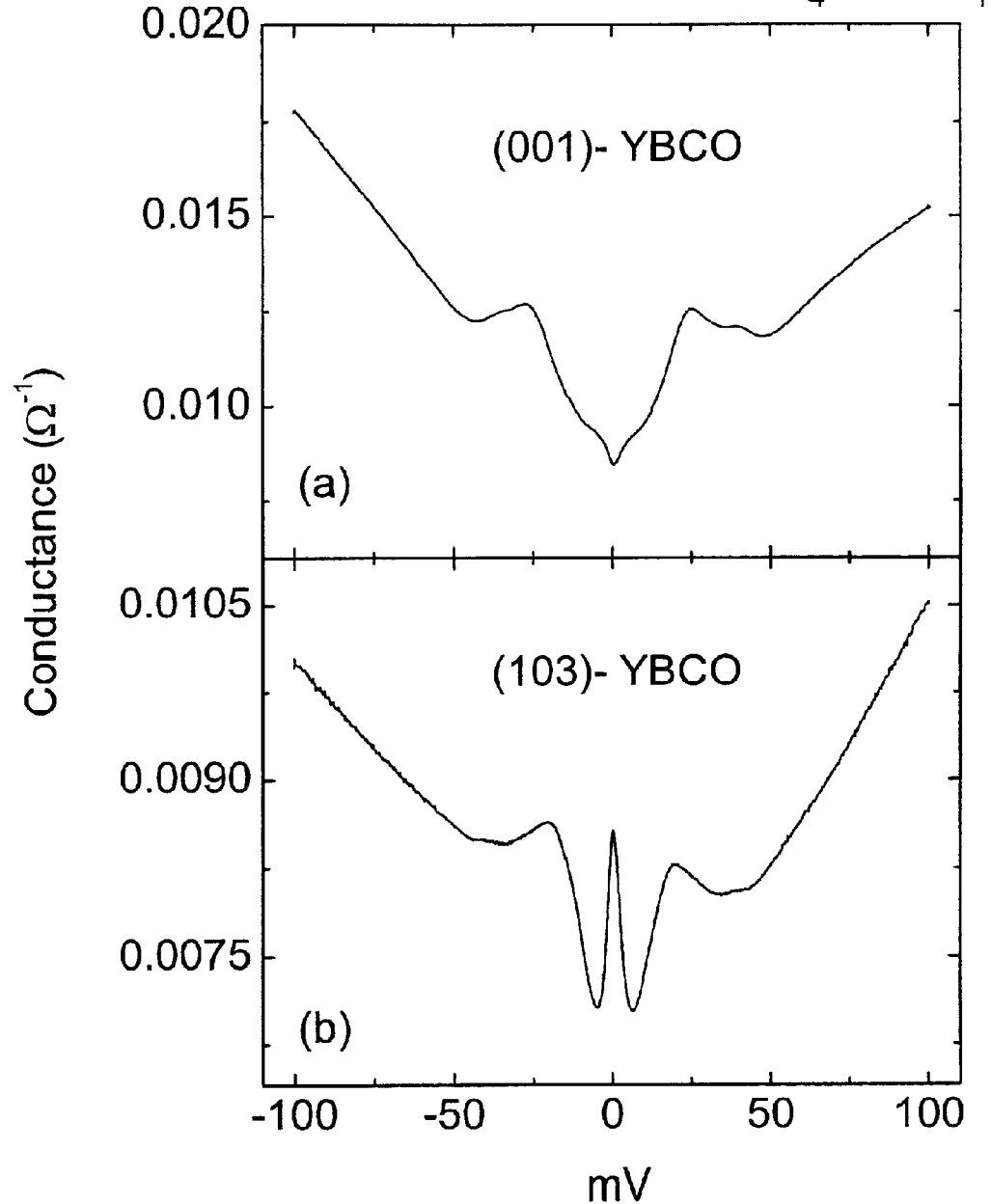
FIG. 6 is a graph of planar tunneling spectroscopy (PTS) data for a tunnel junction.

Features of the PTS graph include gap-like features (GLF) and zero-bias anomalies (ZBA). A gap-like feature may simply be a point of inflection in the graph or, in the case of a conductance curve with sharper features, may be a local maximum or peak. Gap-like features can be observed whether the sandwich structure is formed on the c-axis or whether it is formed on the (103)-oriented surface of the superconductor. Zero-bias anomalies are features that are observed when the applied voltage is zero. For sandwich structures formed on the c-axis of the superconductor, the conductance is observed to decrease dramatically at zero voltage (zero-bias dip). For sandwich structures formed on the (103)-oriented surface of the superconductor, the conductance is observed to increase dramatically at zero voltage (zero-bias peak). The GLF's and ZBA's are observed as sharp features for both the c-axis and (103)-oriented structures, as illustrated in FIG. 6.

Preferably, the high quality oxide films of the present invention are pinhole-free. A pinhole-free film is a film which passes any of the following two tests. The Conductance Dependency Test is a measure of the value of the tunnel junction conductance at a given voltage as dependent on the area of the tunnel junction and the temperature of the measurement. The value of the tunnel junction conductance at a given voltage for a pinhole-free film varies in a linear fashion with the area of the tunnel junction, with a deviation of at most 10%; and the conductance does not change with temperature, with a deviation of at most 20%. The change in conductance with temperature is calculated by factoring out the temperature-dependent effects due to the electrode and counter-electrode resistance and the tunneling density of states.

The Zero-Bias Conductance Test is a measure of the conductance of the tunnel junction with no applied voltage, relative to the conductance of the tunnel junction at voltages above the BCS gap energy. This test is performed using a tunnel junction between YBCO and lead (Pb) at a temperature of 4.2K. The conductance at a bias of 0 meV for a pinhole-free film is 10% or less of the conductance of the film at a bias of 5.0 meV.

The high quality oxide films of the present invention may be used to form a protective coating on a superconductor, hindering degradation of the superconductor. Preferably, a ceramic superconductor which is coated with a high quality oxide film can be stored in air at 25° C. at 100% humidity for at least one week without exhibiting a change in the electronic structure of the superconductor. That is, the electronic structure of the superconductor is unchanged under these conditions. The phrase "electronic structure of the superconductor is unchanged" means that the superconductor exhibits ZBA's and GLF's after the storage period at energies which deviate by at most 20% relative to the energies of the ZBA's and GLF's before the storage period. More preferably, a ceramic superconductor which is coated with a high quality oxide film can be stored in air at 25° C. at 100% humidity for at least one month without exhibiting a change in the electronic structure. Even more preferably, a ceramic superconductor which is coated with a high quality oxide film can be stored in air at 25° C. at 100% humidity for at least six months without exhibiting a change in the electronic structure. Even more preferably, a ceramic superconductor which is coated with a high quality oxide film can be stored in air at 25° C. at 100% humidity for at least one year without exhibiting a change in the electronic structure.

The high quality oxide films of the present invention may be used to make superconducting devices. Superconducting devices include SQUID magnetometers, filters for electromagnetic radiation, magnetic resonance imaging (MRI) instruments, superconducting computers, electric generators wound with superconducting wire, energy storage devices, transformers, and thermometers. The films, when not on superconductors, may also be used to make electronic devices, since these films may be used as resistors between two metals.

EXAMPLES

Tetra-n-propyl zirconate was purchased from ALDRICH CHEMICAL (Milwaukee, Wis.) as a 70% solution by weight in n-propanol. Molecular sieves (3 Å Linde type A, GRACE DAVISON, Columbia, Md.) were activated by heating at 250° C. for at least 24 hours and cooling under vacuum. Solvents such as HPLC grade n-heptane, HPLC grade n-pentane, methylcyclohexane, and toluene were obtained from FISHER SCIENTIFIC (Suwanee, Ga.) or ALDRICH, and were dried over activated molecular sieves, refluxed over Na, and freshly distilled prior to use. Diethylether and benzene (FISHER SCIENTIFIC) were dried over activated molecular sieves, refluxed over Na/benzophenone, and freshly distilled prior to use. Cyclohexane-$d_{12}$ (CAMBRIDGE ISOTOPE LABORATORIES, Andover, Mass.) was dried over activated molecular sieves for at least 24 hours prior to use and subsequently distilled. Methylcyclohexane-$d_{14}$ was dried over Na/K alloy for 24 hours, degassed using three freeze-pump-thaw cycles, and distilled from Na/K alloy. All other solvents were dried over activated molecular sieves for at least 24 hours prior to use.

Tetra-n-propyl zirconate is an extremely moisture-sensitive material, and all manipulations were carried out under an argon or nitrogen atmosphere using standard Schlenk and dry box techniques. All glassware was washed in an ethanolic KOH bath, rinsed with dilute HCl, rinsed with deionized water, and oven-dried for 12 hours at 120° C. Finally, the glassware was thoroughly flame-dried before use by passing the flame from a Bunsen burner over the entire surface of the flask under vacuum (ca. $10^{-2}$ mm Hg). Water vapor was observed upon contact of the flame with the glass, and glassware was heated for approximately three minutes until no further water vapor was visible. The flask was then allowed to cool under vacuum.

Example 1

Preparation of Tetra-n-Propyl Zirconate ($Zr_4(OPr'')_{16}$)

A 250 mL, two-neck round bottom flask with ground glass joints was charged with 100 mL of a 70 wt % solution of partially-hydrolyzed tetra-n-propyl zirconate in n-propanol. The flask was then joined to a nitrogen inlet and a distillation apparatus constructed from a 24 mm i.d. Vigreux reflux column 20.3 cm in length, a distillation head with a thermometer, and a Liebig condenser with a jacket length of 20.0 cm. Components of the distillation apparatus were not connected by ground-glass joints but were instead integrated into a single piece of glassware. A 100 mL single-neck receiving flask was joined to the still body by an elbow fitted with a nitrogen/vacuum inlet. All ground glass joints were sealed with silicone grease and secured with copper wire.

n-Propanol was removed from the partially-hydrolyzed tetra-n-propyl zirconate solution under nitrogen by heating the distillation flask in a silicone oil heating bath and collecting all material that distilled at temperatures less than 100° C. at ambient pressure. The waxy yellow solid remaining in the distillation flask was allowed to cool to room temperature.

Tetra-n-propyl zirconate was distilled under vacuum from the same distillation flask used for the removal of propanol, but using a different distillation apparatus suited for higher temperatures and lower pressures. A heating bath containing 40 wt % $NaNO_2$, 7 wt % $NaNO_3$, and 53 wt % $KNO_3$ at 37° C. was employed. The distillation flask was fitted with a still body identical to the one described above except that the Liebig condenser was replaced with a simple, 1.25 cm i.d. glass condenser. A cow receiver equipped with a nitrogen/vacuum inlet and fitted with one 50 mL and two 100 mL Schlenk flask receivers spaced 45° apart was attached to the still body. All ground-glass joints were sealed with Krytox®

LVP fluorinated grease (70% perfluoroalkyl ether, 30% polytetrafluoroethylene, DUPONT, Wilmington, Del.) and secured with copper wiring. A thermocouple probe was attached to the surface of the condenser, which was subsequently wrapped with heating tape insulated with braided fibrous glass, and the still body and condenser were heavily insulated with glass wool and aluminum foil. The system was evacuated to ca. $10^{-2}$ mm Hg pressure, the condenser was heated to ca. 175° C., and finally, the temperature of the heating bath was raised to 290° C.

Three distinct distillation fractions were observed as the temperature at the distillation head was allowed to rise to 270° C., and these three fractions were collected as follows. Less than 3 mL of a yellow oil distilled between 185° C. and 220° C., the precise amount obtained depending upon the purity of the crude material. About 40 g of analytically pure tetra-n-propyl zirconate was collected between 225° C. and 245° C. as a clear, colorless liquid that solidified immediately upon contact with the collection flask. Finally, about 10 g of a third fraction was collected between 250 and 270° C. as a waxy white or slightly yellow solid. About 20 g of the crude material remained in the distillation pot. Extreme caution was exercised to maintain the condenser at an elevated temperature throughout the distillation, since solidification of the distillate in the condenser at lower temperatures would generate a closed and hence extremely hazardous system.

Material in the distillation pot could not be raised to temperatures above about 200° C. for longer than about 40 minutes. If the distillation was carried out more slowly, a distinct second distillation fraction was not observed, and the tetra-n-propyl zirconate collected at elevated distillation temperatures was seriously contaminated.

Tetra-n-propyl zirconate is highly soluble in diethylether, n-propanol, toluene, benzene, methylene chloride, 1,2-dichloroethane, and hydrocarbons such as n-heptane, n-pentane, and methylcyclohexane. It can be crystallized from n-heptane, n-pentane, toluene, methylene chloride, and 1,2-dichloroethane.

Example 2

Analysis of Tetra-n-Propyl Zirconate ($Zr_4(OPr^n)_{16}$)

Both 500 MHz $^1$H and 125.6 MHz $^{13}C\{^1H\}$ NMR spectra were measured on a UNITY 500 spectrometer (VARIAN, Palo Alto, Calif.), and those recorded at 750 and 188.6 MHz, respectively, were measured on a UNITY INOVA 750 spectromete (VARIAN). Gradient-enhanced $^1$H—$^1$H COSY experiments, gradient phase-sensitive $^1$H—$^{13}$C heteronuclear multiple-quantum coherence (HMQC) experiments, and $^{13}$C inversion-recovery experiments were performed using standard pulse programs. Chemical shifts were internally referenced to tetramethylsilane ($\delta$=0.00). NMR samples were typically prepared by distilling 0.75 mL of deuterated solvent into a 5 mm o.d. NMR sample tube containing ca. 45 mg tetra-n-propyl zirconate. The tube was then flame-sealed under vacuum. Elemental analysis was performed by the University of Illinois Microanalytical Service Laboratory.

Analytical calculation for $Zr_4O_{16}C_{48}H_{112}$ in weight percent is as follows: C, 44.00; H, 8.62; Zr, 27.85. Weight percentages measured were as follows: C, 43.68; H, 8.87; Zr, 28.33.

$^1$H NMR (500 MHz, cyclohexane-$d_{12}$, 22° C.): $\delta$4.20–3.90 (16H, m, —OCH$_2$CH$_2$CH$_3$), 2.13 (2H, br sext, J=7.7 Hz, —OCH$_2$CH$_2$CH$_3$), 1.90 (2H, br m, —OCH$_2$CH$_2$CH$_3$), 1.80 (2H, br m, —OCH$_2$CH$_2$CH$_3$), 1.67 (4H, sext, J=7.4 Hz, —OCH$_2$CH$_2$CH$_3$), 1.60 (6H, br m, —OCH$_2$CH$_2$CH$_3$), 0.94 (9H, t, J=7.4 Hz, —OCH$_2$CH$_2$CH$_3$), 0.90 (6H, t, J=7.5 Hz, —OCH$_2$CH$_2$CH$_3$), 0.86 (6H, t, J=7.6 Hz, —OCH$_2$CH$_2$CH$_3$), 0.83 (3H, t, J=7.5 Hz, —OCH$_2$CH$_2$CH$_3$);

$^1$H NMR (750 MHz, methylcyclohexane-$d_{14}$,–20° C.): $\delta$3.91–4.15 (16H, m, —OCH$_2$CH$_2$CH$_3$), 2.12 (2H, br sext, —OCH$_2$CH$_2$CH$_3$), 1.89 (2H, br m, —OCH$_2$CH$_2$CH$_3$), 1.78 (2H, br m, —OCH$_2$CH$_2$CH$_3$), 1.66 (4H, sext, J=7.3 Hz, —OCH$_2$CH$_2$CH$_3$), 1.59 (4H, sext, J=7.3 Hz, (—OCH$_2$CH$_2$CH$_3$), 1.58 (2H, sext, J=7.3 Hz, —OCH$_2$CH$_2$CH$_3$), 0.95 (6H, t, J=7.3 Hz, —OCH$_2$CH$_2$CH$_3$), 0.94 (3H, t, J=7.3 Hz, —OCH$_2$CH$_2$CH$_3$), 0.90 (6H, t, J=7.3 Hz, —OCH$_2$CH$_2$CH$_3$), 0.87 (6H, t, J=7.3 Hz, —OCH$_2$CH$_2$CH$_3$), 0.83 (3H, t, J=7.3 Hz, —OCH$_2$CH$_2$CH$_3$), $^{13}C\{^1H\}$ NMR (125.6 MHz, cyclohexane-$d_{12}$, 22° C.): $\delta$73.55 (1C, —OCH$_2$CH$_2$CH$_3$), 73.49 (2C, —OCH$_2$CH$_2$CH$_3$), 73.25 (2C, —OCH$_2$CH$_2$CH$_3$), 72.41 (3C, —OCH$_2$CH$_2$CH$_3$), 28.86 (2C, —OCH$_2$CH$_2$CH$_3$), 28.47 (1C, —OCH$_2$CH$_2$CH$_3$), 27.92 (2C, —OCH$_2$CH$_2$CH$_3$), 26.85 (2C, —OCH$_2$CH$_2$CH$_3$), 24.30 (1C, —OCH$_2$CH$_2$CH$_3$), 10.96 (3C, —OCH$_2$CH$_2$CH$_3$), 10.60 (2C, —OCH$_2$CH$_2$CH$_3$), 10.19 (1C, —OCH$_2$CH$_2$CH$_3$), 10.00 (2C, —OCH$_2$CH$_2$CH$_3$), $^{13}C\{^1H\}$ NMR (188.6 MHz, methylcyclohexane-$d_{14}$, –20° C.): $\delta$73.28 (—OCH$_2$CH$_2$CH$_3$), 73.13 (—OCH$_2$CH$_2$CH$_3$), 73.06 (—OCH$_2$CH$_2$CH$_3$), 72.07 (—OCH$_2$CH$_2$CH$_3$), 72.03 (—OCH$_2$CH$_2$CH$_3$), 28.68 (—OCH$_2$CH$_2$CH$_3$), 28.27 (—OCH$_2$CH$_2$CH$_3$), 27.74 (—OCH$_2$CH$_2$CH$_3$), 26.70 (—OCH$_2$CH$_2$CH$_3$), 23.96 (—OCH$_2$CH$_2$CH$_3$), 11.03 (—OCH$_2$CH$_2$CH$_3$), 11.01 (—OCH$_2$CH$_2$CH$_3$), 10.64 (—OCH$_2$CH$_2$CH$_3$), 10.39 (—OCH$_2$CH$_2$CH$_3$), 10.14 (—OCH$_2$CH$_2$CH$_3$).

Example 3

Preparation of YBCO Superconducting Films

YBa$_2$Cu$_3$O$_7$ (YBCO) high-temperature superconducting films were grown by off-axis planar magnetron sputter deposition on oriented, single-crystal SrTiO$_3$ (STO) substrates. Depending on the orientation of the substrate, and whether or not a PrBa$_2$Cu$_3$O$_7$ (PBCO) buffer layer is first grown on the substrate, the YBCO film can grow in four crystallographic orientations. The (001)- and (103)-oriented YBCO are grown on (100)- and (110)-oriented STO, respectively if no PBCO buffer layer is grown. If a PBCO buffer layer is grown, the (100)- and (110)-oriented YBCO are grown on (100)- and (110)-oriented STO, respectively.

Example 4

Analysis of YBCO Superconducting Films

Every film grown for tunneling measurements had at least one companion analysis film, a smaller film of the same orientation, which was often cleaved from the same single crystal substrate. The analysis film was grown simultaneously and positioned adjacent to the film used for tunneling analysis X-Ray Diffraction was used to measure the crystal structure and orientation of the film as well as any possible mosaic distribution (i.e. domain structure within the crystal) or strain variation (i.e. "stretching" of the crystal structure) within the films. This technique simultaneously measured the same qualities in the underlying substrate. These measurements were made on a PHILIPS X'PERT diffractometer (PHILIPS ANALYTICAL, Natick, Mass.) at the Materials Research Laboratory Center for Microanalysis of Materials, a Department of Energy national user facility.

Resistivity versus temperature ($\rho$ vs. T) measurements were made on the analysis films to determine the room temperature resistivity, residual resistivity ratio [$\rho(300K)/\rho(100K)$] and the upper bound of the critical temperature ($T_c$, i.e. the temperature at which the material becomes superconducting). A measurement of zero resistance by this technique indicates the presence of a single percolative path for superconducting current in the sample. The $\rho$ vs. T measurements were made by the standard four-probe technique at an analysis temperature of 4.2 K.

To determine the $T_c$ of the bulk film, the magnetic susceptibility of the analysis films was measured using a QUANTUM DESIGN 1T MAGNETIC PROPERTY MEASUREMENT SYSTEM (MPMS, a facility of the Materials Research Laboratory Magnetic Characterization Facility). This device uses a Superconducting Quantum Interference Device (SQuID) magnetometer to measure the diamagnetic response due to the Meissner Effect in the Superconductor. This measurement can reveal what percentage of the material is superconducting.

The morphology of the tunnel junction devices is strongly dependent on the surface quality of the films. To determine the surface quality, a Scanning Electron Microscope (SEM) was used to take Micrograph images of the surface up to 150,000 times magnification (resolution approximately 10 nm). We make the measurements on a HITACHI S-4700 SEM (HITACHI SCIENTIFIC INSTRUMENTS, Pleasanton, Calif.).

Example 5
Formation of Metal Oxide Film on YBCO

The $YBa_2Cu_3O_7$ samples were removed from the deposition chamber and transferred to a 200 ml, single neck Schlenk flask purged with argon. This transfer exposed the samples to the atmosphere for about 10 minutes. The following seven-step process was then repeated 14 times:

1) The samples were transferred to an argon filled glove box and placed in a 35 mL beaker containing 15 mL of a 9 mM solution of $Zr_4(O''Pr)_{16}$ in methylcyclohexane.
2) After 15 minutes, the samples were removed and placed in another 30 mL beaker containing 2 mL of methylcyclohexane. After two minutes, the samples were transferred to another 30 mL beaker containing 2 mL of methylcyclohexane.
3) After another two minutes, the samples were removed and rinsed twice with a 5¾ inch pasteur pipette full of methylcyclohexane.
4) The samples were then removed from the dry box and placed in a 5 ml solution of 20% $H_2O$ in n-propanol for 15 minutes under ambient conditions.
5) The hydrolyzed samples were then placed in a 30 mL beaker containing 2 ml of n-propanol.
6) After 2 minutes, the samples were placed in a 30 mL beaker containing 2 mL of n-propanol.
7) The samples were rinsed twice with a 5¾ inch pasteur pipette full of n-propanol.

One repetition of steps 1–7 corresponds to one condensation/hydrolysis cycle. After the entire treatment procedure, the samples were brought back into the dry box and stored until the tunneling measurements or XPS analysis were made.

This process may be carried out using a dry bag with flowing argon, rather than a dry box. Also, the times that films are submerged in the zirconium containing solution and $H_2O$ solution may be varied. Preferably, the submersion times are at least 5 minutes.

Example 6
XPS Analysis of Metal Oxide Film on YBCO

A PHI model 5400 x-ray photoelectron spectrometer (PHYSICAL ELECTRONICS, INC., Eden Prairie Minn.) was used to collect the X-ray photoelectron spectra. It was equipped with a spherical capacitor electrostatic energy analyzer, a dual channel plate position sensitive detector, and small area electron extraction optics. Achromatic Mg $K_\alpha$ X-radiation (hv=1253.5 eV, 15 kV, 400 W) was used to excite the sample, at a base pressure of $10^{-9}$ Torr. A pass energy of 178.95 eV, 1 eV/step was used to collect the survey spectra, and a pass energy of 35.75 eV, 0.1 eV/step was used to collect the multiplex spectra. The resulting spectra were collected at an emission angle of 45°.

Figure 4:
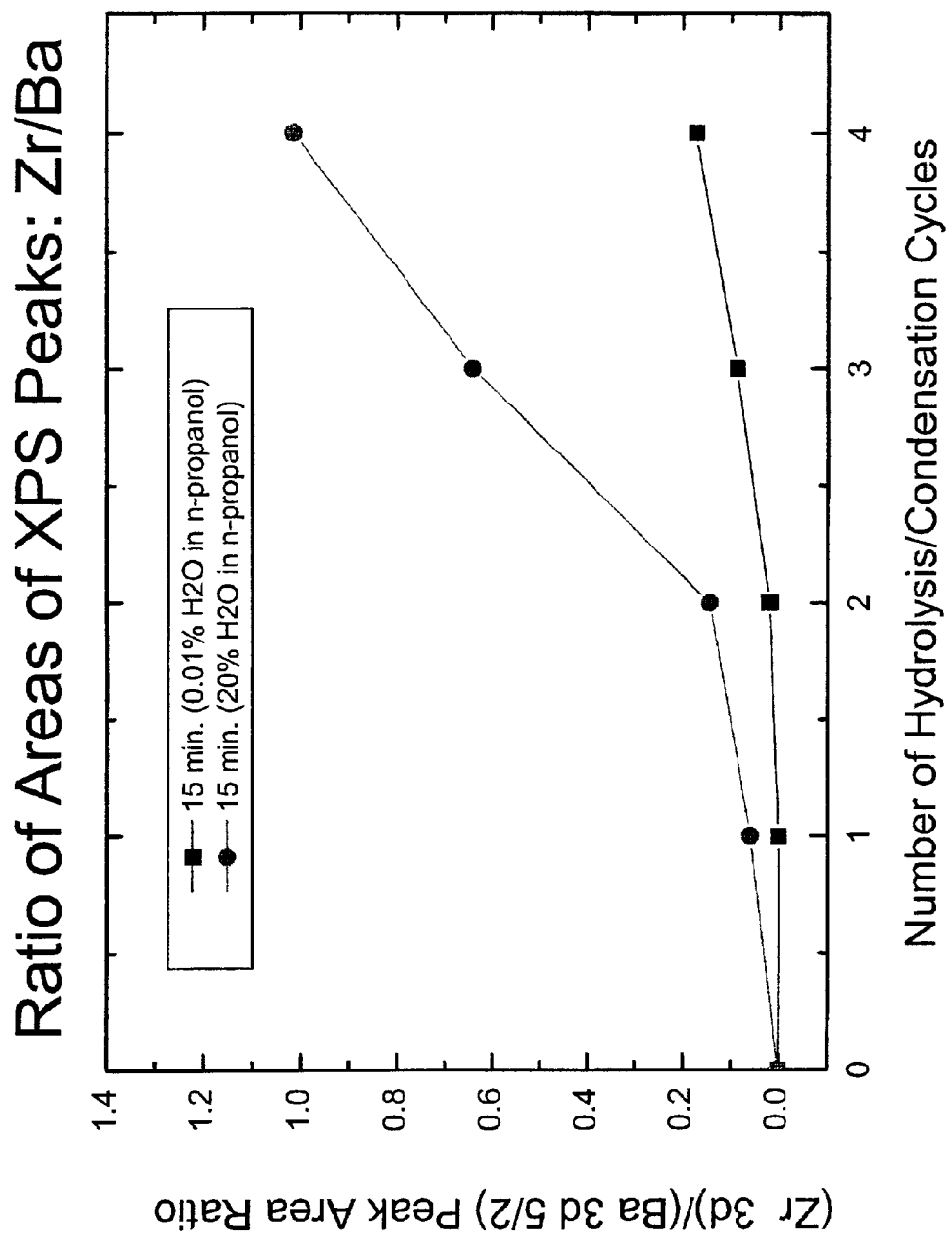
FIG. 4 is a graph of the ratio of the areas of the zirconium and barium XPS peaks as a function of the number of condensation/hydrolysis cycles.
Figure 5:
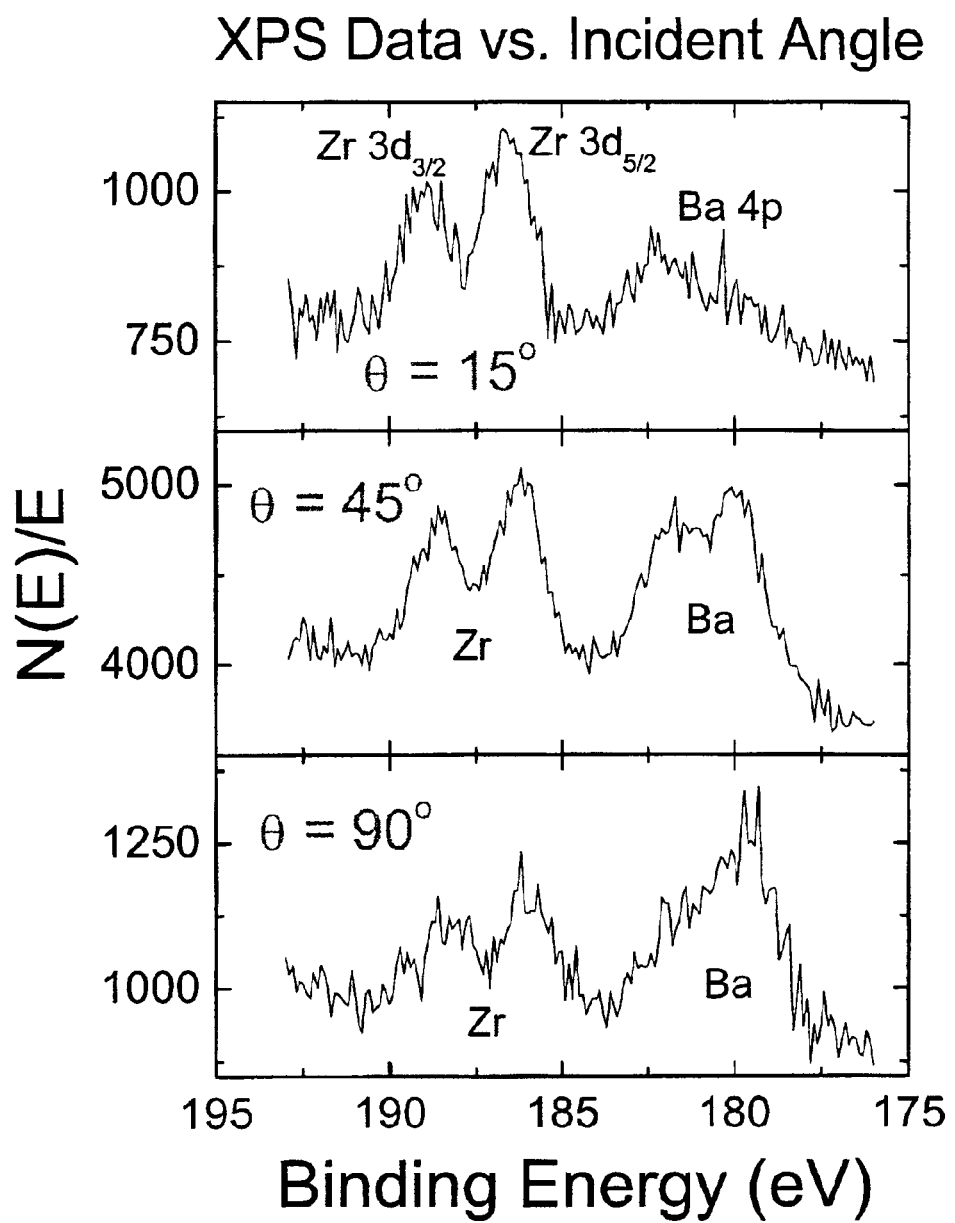
FIG. 5 is a set of XPS spectra for different angles of analysis.

FIG. 4 illustrates the effect of the hydrolysis step in the film forming process can be seen. This graph shows the buildup of zirconium oxide on the surface by plotting the increase in the ratio of the areas of the zirconium peak and the barium peak as a function of the number of condensation/hydrolysis cycles. An increase in the Zr:Ba peak area indicates an accumulation of zirconium on the surface. This buildup occurs more rapidly when the hydrolysis solution contains 20% water than when the hydrolysis solution contains 0.01% water. Thus, the hydrolysis of the $Zr_4(O''Pr)_{16}$ layer allows for the accumulation of more zirconium compound on the surface.

Example 7
Tunneling Spectroscopy Analysis of Metal Oxide Film on YBCO

Tunnel junctions were measured using a standard four-probe geometry. The counter electrode was deposited one of two ways: 1) either a metal such as Ag, Au or Cu was thermally evaporated or 2) Ag paste (LEITSILBER 200, TED PELLA, INC., Redding, Calif.) was deposited on the coated surface. The two methods yield comparable results. Although the Ag paste junctions had a higher reproducibility, junctions employing evaporated counterelectrodes were more robust over time. Tunneling conductance (dI/dV vs. V) measurements were made by injecting an ac current (dI) superimposed on a dc bias current (I) between the superconducting film and the counter-electrode, through the ultra-thin, insulating, dielectric layer. The resulting dc bias voltage (V) was read by a voltmeter after the signal was low-pass filtered through a low-noise preamplifier (SR560, STANFORD RESEARCH SYSTEMS, Sunnyvale, Calif.). The signal was also measured with a lock-in amplifier (SR830 DSP, STANFORD RESEARCH SYSTEMS) tuned to the same frequency as the ac current in order to determine the ac voltage response (dV). The data were collected on a computer using the LABVIEW application. From this data, the conductance was found either by taking a numerical derivative of I vs. V, or more directly by dividing the dI signal by the dV signal. The conductance as a function of applied voltage for oxide films on (001)-YBCO and on (103)-YBCO is illustrated in FIG. 6.

Figure 7:
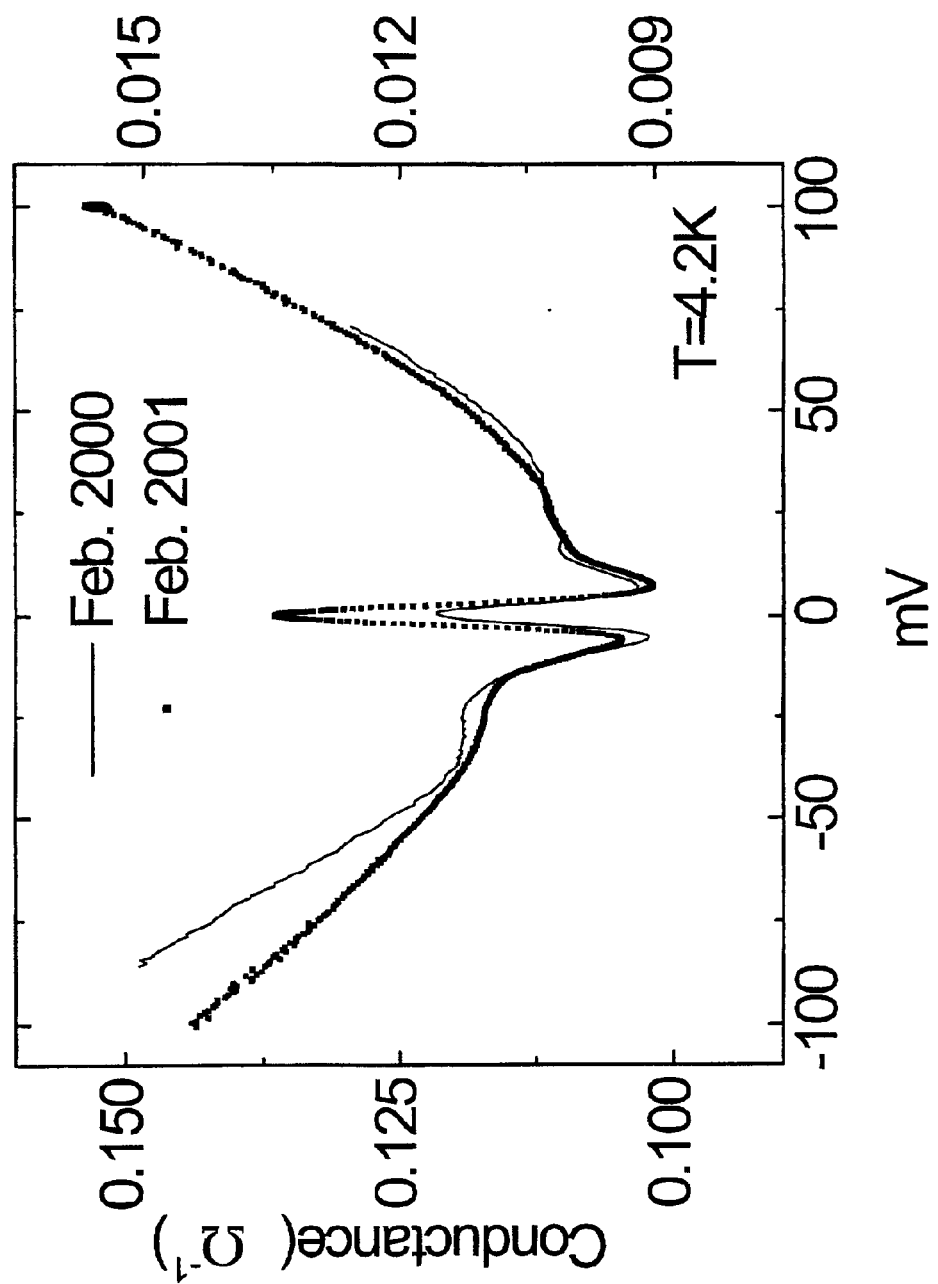
FIG. 7 is a set of graphs of PTS data for tunnel junctions fabricated one year apart but utilizing the same oxide film.

Referring to FIG. 7, tunneling conductance characteristics were measured for (103)-YBCO/zirconia/Ag junctions at 4.2K in February 2000 (line, scale at left) and in February 2001 (points, scale at right). Both junctions were fabricated from the same YBCO/zirconia sample, with each junction fabricated on the same day as the measurement was obtained. That is, the junctions were fabricated one year apart. Between the two measurements, the films were stored at ~30% relative humidity and ambient temperature. Reproducibility of the features of the tunneling data over this time scale shows the remarkable stability of the materials involved. The ZBA occured at 0 meV, and the GLF's occured at about ±18–19 meV for both junctions, indicating that the electronic structure of the superconductor was unchanged.

What is claimed is:

1. A compound of formula (I)

$$M_4(OPr^n)_{16} \quad (I);$$

wherein M is zirconium or hafnium; and wherein the purity of the compound is at least 97% as measured by NMR spectroscopy.

2. The compound of claim 1, wherein the purity of the compound is at least 99% as measured by NMR spectroscopy.

3. The compound of claim 1 wherein M is zirconium.

4. A method of making the compound of claim 1, comprising:

distilling $M(OPr^n)_4$.

* * * * *

UNITED STATES PATENT AND TRADEMARK OFFICE
CERTIFICATE OF CORRECTION

| | | |
|---|---|---|
| PATENT NO. | : 6,838,404 B2 | Page 1 of 1 |
| APPLICATION NO. | : 10/044831 | |
| DATED | : January 4, 2005 | |
| INVENTOR(S) | : Margaret M. Pafford | |

It is certified that error appears in the above-identified patent and that said Letters Patent is hereby corrected as shown below:

<u>Title page,</u>
Item [12], delete "Hentges et al." and insert -- Pafford et al. --.
Item [75], Inventors, delete the following names:
"Patrick J. Hentges, Urbana, IL (US)
Laura H. Greene, Urbana, IL (US)
Glenn Westwood, Urbana, IL (US)".

Signed and Sealed this

Twenty-seventh Day of June, 2006

JON W. DUDAS
*Director of the United States Patent and Trademark Office*